United States Patent [19]

Moehlmann

[11] Patent Number: 5,386,194
[45] Date of Patent: * Jan. 31, 1995

[54] DIGITAL IMPEDANCE DETERMINATION USING PEAK DETECTION OF CURRENT AND VOLTAGE SAMPLERS

[75] Inventor: Richard H. Moehlmann, Rochester, N.Y.

[73] Assignee: Harris Corporation, Melbourne, Fla.

[*] Notice: The portion of the term of this patent subsequent to Apr. 27, 2000 has been disclaimed.

[21] Appl. No.: 52,729

[22] Filed: Apr. 27, 1993

Related U.S. Application Data

[63] Continuation-in-part of Ser. No. 779,046, Oct. 18, 1991, Pat. No. 5,206,600.

[51] Int. Cl.$^6$ ............................................. G01R 27/02
[52] U.S. Cl. ........................................ 324/650; 324/713
[58] Field of Search ............... 324/103 P, 103 R, 609, 324/638, 642, 637, 691, 713, 715, 650; 455/115

[56] References Cited

U.S. PATENT DOCUMENTS

| | | | |
|---|---|---|---|
| 3,970,925 | 7/1976 | Procter et al. | 324/649 |
| 4,409,544 | 10/1983 | Redlich | 324/650 |
| 4,500,834 | 2/1985 | Ko et al. | 324/534 |
| 4,647,871 | 3/1987 | Turner, Jr. | 330/298 |
| 4,704,573 | 11/1987 | Turner, Jr. | 324/646 |
| 4,721,901 | 1/1988 | Ashley | 324/646 |
| 4,769,592 | 9/1988 | Potter et al. | 324/638 |
| 4,782,281 | 11/1988 | Williamson | 324/727 |
| 4,799,066 | 1/1989 | Deacon | 343/861 |
| 4,904,927 | 2/1990 | Garbe et al. | 324/642 |
| 4,962,359 | 10/1990 | Dunsmore | 324/638 |
| 4,965,607 | 10/1990 | Wilkins et al. | 343/861 |
| 4,967,159 | 10/1990 | Manes | 324/650 |
| 5,206,600 | 4/1993 | Moehlmann | 324/650 |

*Primary Examiner*—Kenneth A. Wieder
*Assistant Examiner*—Christopher M. Tobin
*Attorney, Agent, or Firm*—Rogers & Killeen

[57] ABSTRACT

A system and method for determining the complex impedance of a load, such as an antenna in an RF transmission system. The system samples both the voltage and current of the signal passing through a transmission line and directly derives digitally the impedance parameters independently of the amplitude or phase of the signal.

16 Claims, 4 Drawing Sheets

DIGITAL IMPEDANCE DETERMINATION USING PEAK DETECTION OF CURRENT AND VOLTAGE SAMPLERS

This application is a continuation-in-part of U.S. application Ser. No. 779,046, filed Oct. 18, 1991, now U.S. Pat. No. 5,206,600.

BACKGROUND OF THE INVENTION

The present invention relates generally to the determination of the characteristic impedance of a load in an electronic circuit. More specifically, the invention concerns a method and apparatus to calculate complex load parameters independently of amplitude, impedance, or phase of the input signal source. The invention has particular application in a "smart" tuning scheme in which a transmitter is coupled to an antenna which has an impedance that is different than the characteristic impedance of the antenna.

It is well known in the field of RF signal transmission that the output impedance of an RF signal source should match the input impedance of its load. When the match is made, the efficiency of the power transfer between the source and the load is maximized. Theoretically, if the impedances are exactly matched, the load absorbs 100% of the signal transmitted from the source. On the other hand, when there is a difference between the load impedance and the impedance of the source, the load does not fully absorb the entire signal from the source and "reflects" a portion of the signal back toward the source.

In a conventional RF transmission system, a transmitter is connected to an antenna through a device normally referred to as an antenna coupler. The function of the coupler is to transform the impedance of the antenna to the desired characteristic impedance of the transmitter, normally referred to as $Z_0$.

If all of the elements of such a transmission system remained constant, the coupler could be fixed and would not need to be changed. However, in practice, there are many factors which vary the impedance of the various elements in the transmission system, and thus, the impedance coupler must be changed. For example, the characteristics of antennas are known to change over time as the antennas endure ice loading, salt degradation, sag, and other elements of damage. Significantly, in the case of mobile RF transmission systems, the characteristic impedance of an antenna is known to vary considerably with changes in the natural surroundings of the antenna. Further, the impedance of the antenna and other elements in a transmission system is usually dependent upon the frequency of the signal being transmitted. Thus, mobile frequency hopping transmission systems encounter many changes in the characteristic impedance of the elements of the system for which it is necessary to change the operation of the coupler between the transmitter and its associated antenna.

Prior art systems used differing techniques to identify when the coupler needed it to be changed and to identify what changes needed to be made. For example, it was known in the prior art to measure the Voltage Standing Wave Ratio ("VSWR") of a transmitting system. If the VSWR exceeded a predetermined threshold, such as 2.5, prior art systems were known to attempt to alter the elements of the coupler to reduce the VSWR. Because the VSWR measures the ratio between the forward and reflected signals, it was considered a measure of the relative "goodness" of the impedance matching, a high VSWR indicating a relatively poor match and, accordingly, a relatively high reflected signal.

It was known in the prior art to use an array of inductors and/or capacitors which could be changed, either mechanically or electronically, so that the coupler could operate as a variable signal impedance transformer. For example, some early such systems used turbo servo driven variable capacitors and roller inductors to attain the necessary transformation. More modern systems use digitally switched inductors and capacitors banks controlled by a micro-processor based logical system. Such systems are illustrated in the U.S. Pat. No. 4,965,607 to Wilkins, et al. and in U.S. Pat. No. 4,799,066 to Deacon.

In previously known frequency hopping communication systems, it is generally desired to transmit only briefly, often for only milliseconds in duration, on a frequency, before the frequency is changed to the next frequency to be followed in the selected hopping scheme. Because the amount of time during which data is transmitted on any one hop is limited, it is often important that the tuning scheme which mates the transmitter to its antenna operate very quickly. Oftentimes, however, tuning schemes in the prior art which measure the VSWR of a signal being transmitted require a period of time longer than an individual hop to identify the appropriate antenna coupler configuration to provide impedance matching at the specific frequency. In such systems, it was known to measure the mismatch on a hop, to compute adjusted tuning values for the next hop at the same frequency and to store the adjusted tuning values in a memory device. Subsequently, when the hopping scheme was scheduled to transmit on a frequency which had previously been tested, the adjusted values would be utilized to set the tuning components, the signal transmitted, the mismatch computed and the tuning components revised and re-stored. In such systems, convergence of the determination of the tuning components proceeded in a trial and error fashion until an acceptable impedance mismatch occurred. Often the impedance mismatch was monitored and calculated on subsequent transmissions and if it once again exceeded an acceptable level, the iterative adjustment of the tuning components based upon the magnitude and direction of the impedance mismatch was again computed.

Prior art systems which utilize a measure of the impedance mismatch, such as the VSWR, had certain disadvantages in they sometimes would require the repeated or iterative attempts at changing tuning components while hunting for an acceptable mismatch level. While the mismatch was being reduced to acceptable levels, it is was known to transmit only training signals or predetermined signals so that information would not be lost while the mismatch was reduced. Such technique, while successful in many instances in reducing impedance mismatch to an acceptable level, did so at the cost of exposing the signal to interception by unfriendly persons interested in detection for jamming and intelligence gathering purposes. Typically, in many prior art systems, the training signals are sent at or near full power because the detection method was power dependent, or required a relatively large power to provide meaningful information. The additional transmissions for training purposes increase the likelihood of detection of the hopping scheme by personnel unfriendly to the user of the system.

It is, therefore, an object of the present invention to provide a novel system and method for determining the impedance of a load without a need for a multi-iteration trial and error tuning network adjustment.

It is still another object of the present invention to provide a novel system and method to determine the impedance of a load independently of the amplitude of the signal being transmitted.

It is still another object of the present invention to compute the impedance of a load independent of the phase or impedance of the input signal source.

These and many other purposes and advantages of the present invention will become apparent from a reading of the following description in view of the drawing figures.

DESCRIPTION OF PREFERRED EMBODIMENT

Figure 1:
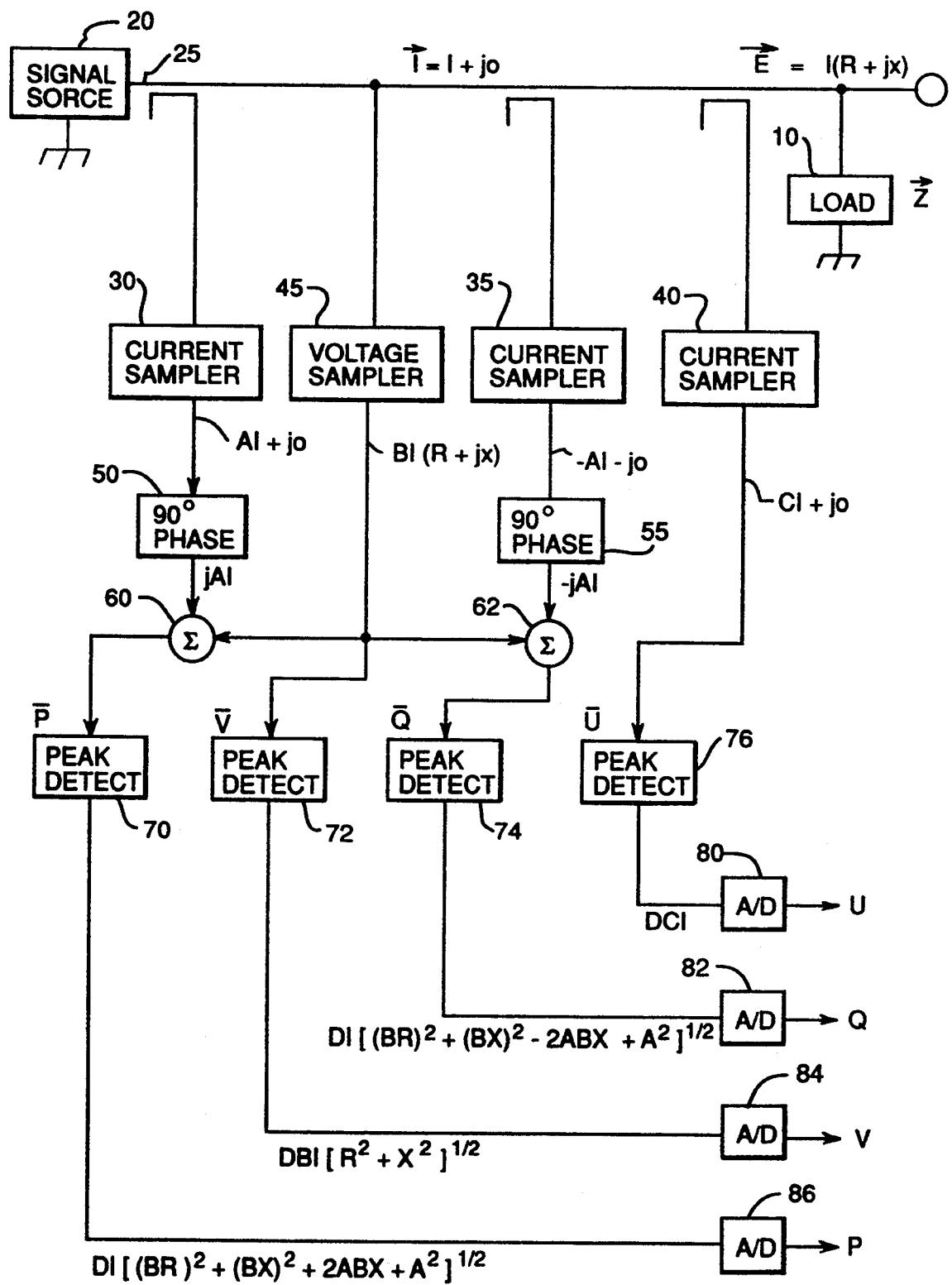
FIG. 1 is a functional block diagram of a system in accordance with the present invention, particularly the analog portion thereof.

With reference to FIG. 1, the present invention provides a means of calculating all of the parameters of a complex load impedance, $\vec{Z}$. The impedance of the load 10 may be defined as:

$$\vec{Z} = R + jX = Z\angle\phi = Z\cos\phi + jZ\sin\phi.$$

The shunt parameters of such a system, $R_p$ and $X_p$, are defined as:

$$R_p = Z/\cos\phi \text{ and } X_p = Z/\sin\phi.$$

In general a signal source 20 may provide a signal along a transmission path 25 having a current of $$\vec{I} = I + j0.$$

Quadrature current samples may be taken of the current along the transmission line 25. Current samplers 30, 35 and 40 sample the current along the line 25. The measures of the current may be expressed, respectively as to each of the samplers 30, 35, 40 as:

$$AI + j0$$

$$-AI - j0$$

$$CI + j0$$

The signals from current samplers 30 and 35 are passed through phase shifters 50, 55 and added to the voltage sample signal from a voltage sampler 45 by summers 60 and 62 respectively to produce the complex signals $\vec{P}$ and $\vec{Q}$. The signals for the summers 60 and 62, along with the signals from the voltage sampler 45 and the third current sampler 40 are each independently peaked detected, via peak detectors 70, 72, 74, and 76 and the peak detected signals are provided to analog/digital converters 80, 82, 84 and 86. The peak detectors are each assumed to detect the absolute magnitude of a complex signal with a conversion factor $0 + D$.

EXAMPLE

Input to peak detector $= M + jN$

Output of peak detector $= D[M^2 N^2]^{\frac{1}{2}}$

Each of the peak detected values may be converted to digital form by the analog/digital converters 80, 82, 84 and 86 to produce signals U, Q, V and P, respectively.

Each of the output signals U, Q, V and P are digital outputs which may be passed to the digital section of the present invention, described below.

The mathematical basis for the operation of the circuit of FIG. 1 rests primarily on the fact that $(P^2 - Q^2) \alpha I^2 X$ Specifically, $$(P^2 - Q^2) = D^2 I^2 [(BR)^2 + (BX)_2 + 2ABX + A^2] - D^2 I^2 [(BR)^2 + (BX)^2 - 2ABX + A^2]$$

$$(P^2 - Q^2) = 4ABD^2 I^2 X = 4ABD^2 I^2 Z \sin\phi$$

Since A, B and D are known constants, $(P^2 - Q^2) \alpha I^2 X$

An alternative method of showing the mathematical basis of the circuit of FIG. 1 uses summations of unshifted current samples and a quadrature voltage sample:

(a) If the current samples equal $AI$ and $-AI$
(b) If the voltage sample equals $j[BI(R + jX)]$ then the signals to the peak detector will be $$\vec{P} = I[A + BX + jBR]$$

$$\vec{Q} = I[-A + BX + jBR]$$

and the outputs of the peak detector will be:

$$P = DI[A^2 + B^2 X^2 + 2ABX + B^2 R^2]^{\frac{1}{2}}$$

$$Q = DI[A^2 + B_2 X^2 - 2ABX + B^2 R^2]^{\frac{1}{2}}$$

$$P^2 - Q^2 = 4ABD^2 I^2 X,$$

which is the same as above.

Figure 2:
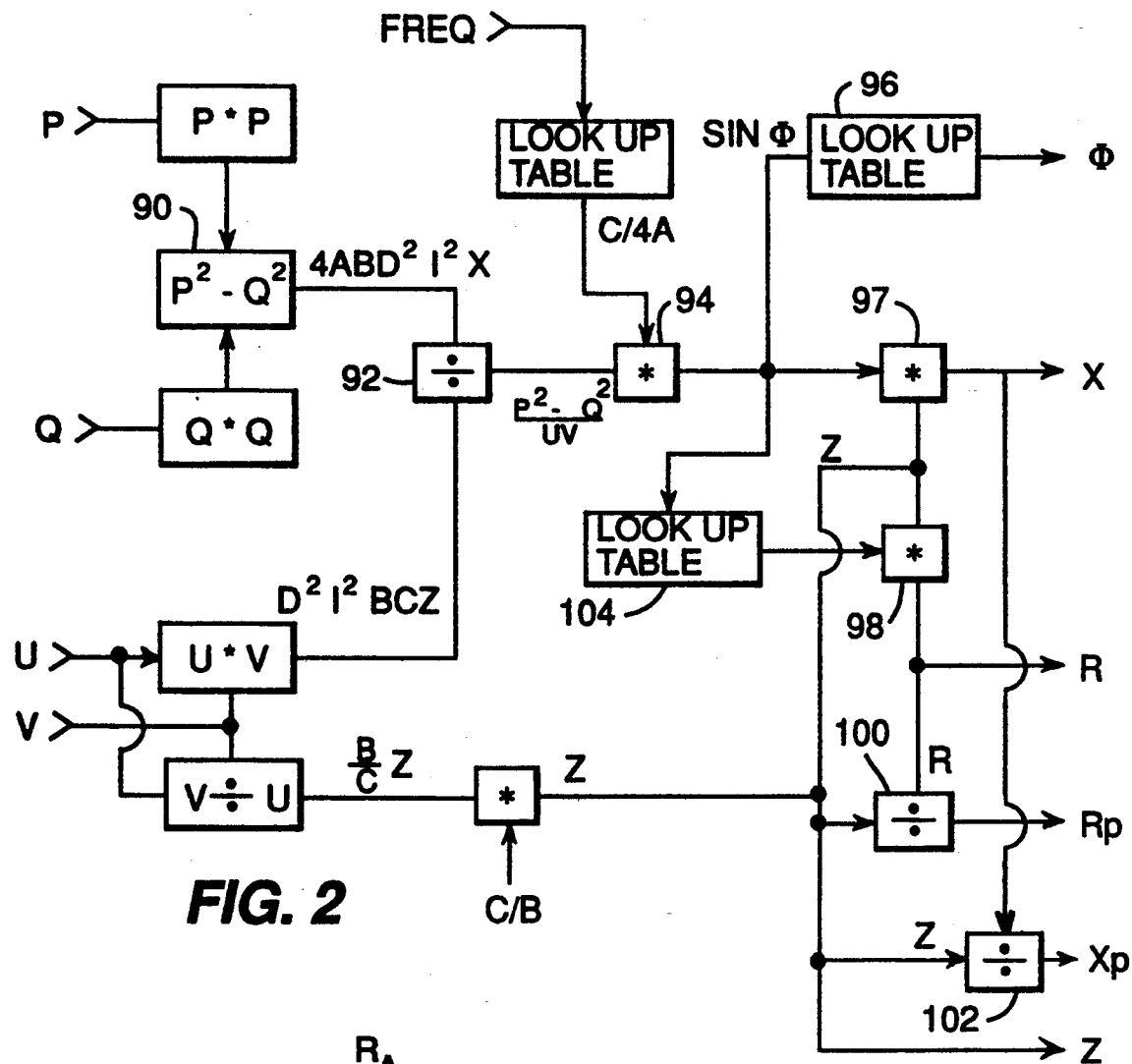
FIG. 2 is a functional block diagram of a system in accordance with the present invention, particularly the digital portion thereof.

With reference to FIG. 2, the digital signals P, Q, U and V may be processed digitally to generate all of the parameters required to describe the complex load. In particular, the signals P and Q may both be squared and the difference computed by a conventional adding device 90 to produce a signal related to $P^2 - Q^2$. The signals U and V may be multiplied together and the multiplicand provided to a conventional divider 92 to provide a signal related to $(P^2 - Q^2)/UV$. The signal provided by the divider 92 may be multiplied by a frequency dependent signal related to the parameter $C/4A$ in a multiplier 94. $C/4A$ is obtained from lookup table 91. The output signal from multiplier 94 is $\sin\phi$ which may be the input to a conventional lookup table 96 which computes the inverse of the sin to provide $\phi$, the angle of the load impedance. The output from lookup table 91 may also be provided to a cosine lookup table 104 for computation of the parameters $R^p$ and $X^p$. Similarly, by the use of the multipliers 97, 93, and 98 and additional dividers 100 and 102, each of the load parameters of interest may be calculated:

Z-from multiplier 93
$\phi$-from lookup table 96
sin $\phi$-from multiplier 94
cos $\phi$-from lookup table 104
R=Z cos $\phi$ from multiplier 98
X=Z sin $\phi$ from multiplier 97
$R_p$=Z/cos $\phi$ from divider 100
$X_p$=Z/sin $\phi$ from divider 102

Figure 3:
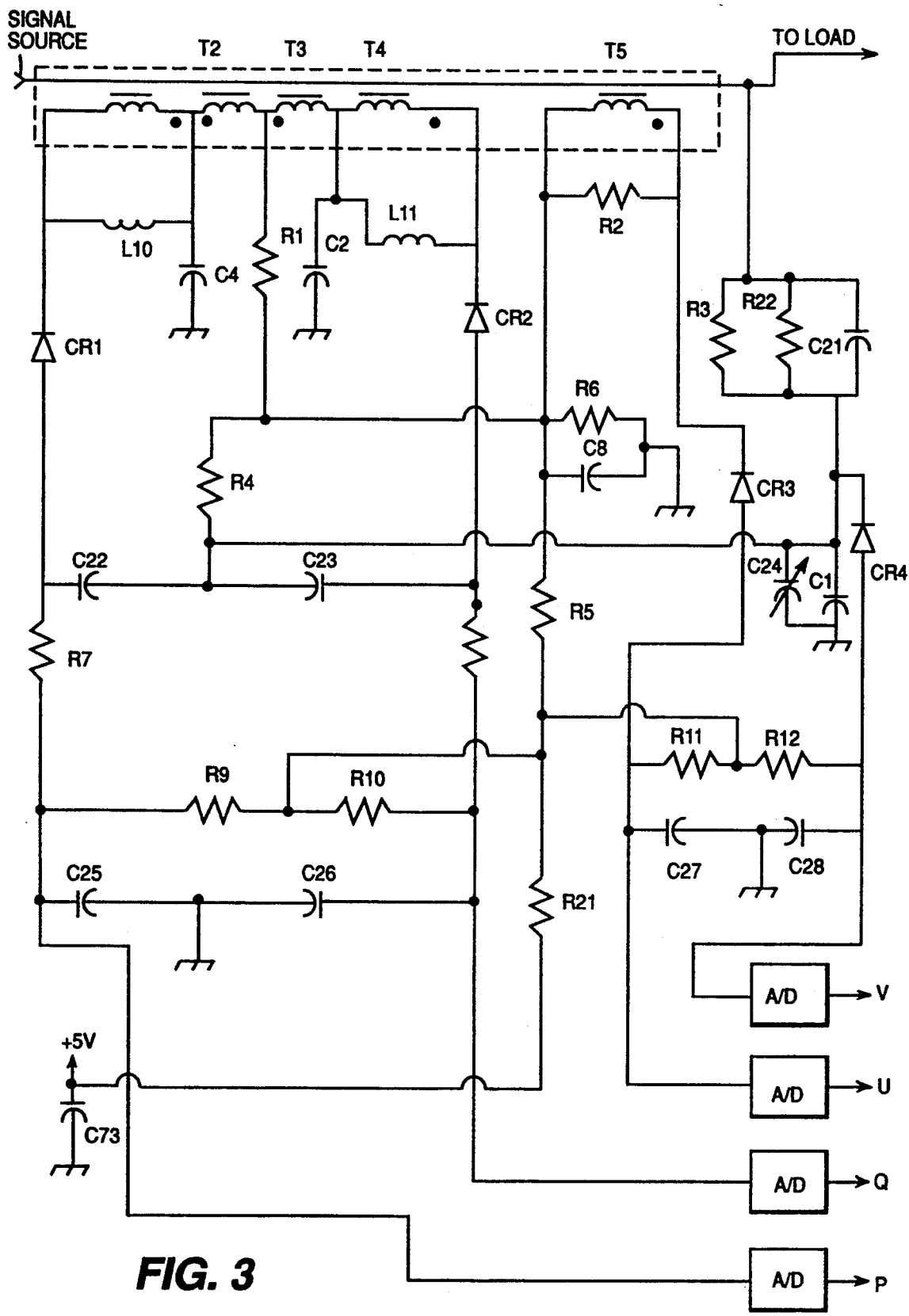
FIG. 3 is a circuit diagram of a circuit which may be utilized to provide the analog portion of the system of FIG. 1.

The constants B and C are chosen so that the parameter U will go to the parameter V when Z is equal to Ro or DBIRo=DCI C/B=Ro or U/V=Z/Ro With reference to FIG. 3, a circuit of the analog portion of the present invention may include high permeability toroids T2, T3, T4 and T5. The signal current passes through the center of the toroids, T2–T5 creating transformers. If the toroid T5 has N turns then the transformer at T5 has a turns ratio of 1:N. If the resistance of R2 is much less than the impedance of Z5 (the impedance of the toroid, T5), then the rf voltage across R2, (E5) is:

$$E5 = \frac{R2}{N} I \text{ (in FIG. 3) and}$$

$$\frac{R2}{N} = C \text{ (in FIG. 1), or } \vec{U} = CI + j0$$

Figure 4:
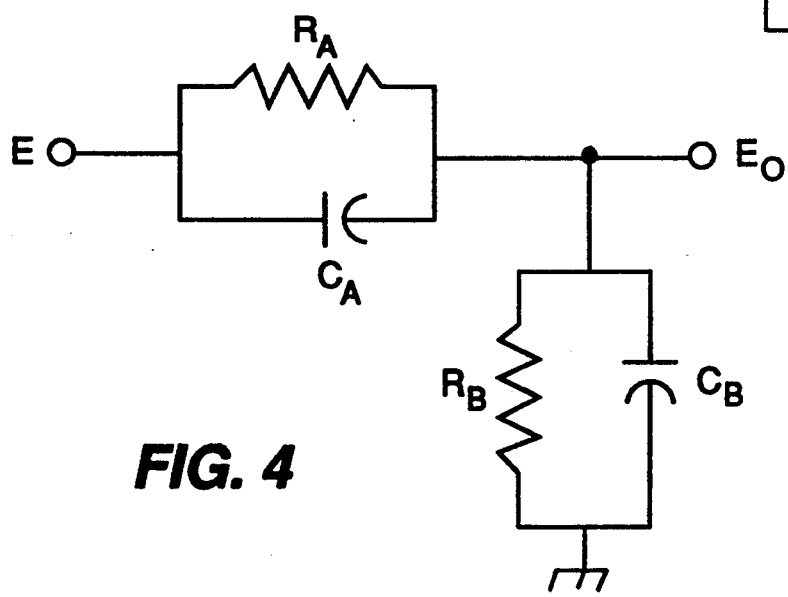
FIG. 4 is a circuit diagram of a voltage sampler which may be used in the system of FIG. 1.

With further reference to FIGS. 3 and 4, the voltage sampler of FIG. 3 can be considered the RC network as shown in FIG. 4. If the components of the circuit of FIG. 4 are selected such that $$R_A C_A = R_B C_B$$

then $Eo = \left[ \dfrac{R_B}{R_A + R_B} \right] E \quad Eo = \left[ \dfrac{C_A}{C_A + C_B} \right] E$ and the network is frequency independent. In FIG. 3, $R_2$ and $R_{22}$ comprise element RA of FIG. 4 and $R_4$ serves as element RB. Additionally, capacitor C21 of FIG. 3 forms CA of the RC network and capacitors C1 and C21 of the circuit of FIG. 3 comprise the element CB of the network of FIG. 4. Accordingly, in FIG. 1

$$B = \frac{R_2}{R_1 + R_2}, \text{ and } \vec{V} = BI(R + jX)$$

Figure 6:
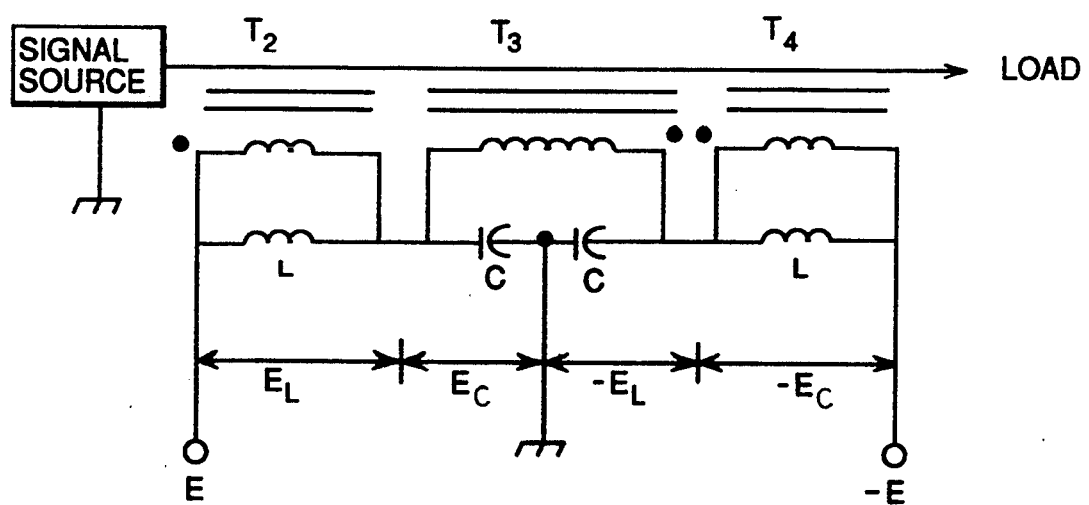
FIG. 6 is a circuit diagram of a current sampler circuit which may be used in the system of FIG. 1.

The operation of the circuit of FIG. 3 may be understood with further reference to the wideband quadrature network circuit of FIG. 6. With reference to FIG. 6, the network circuit includes a signal source 300 which provides a signal to a load along a coax line 310. The coax line 310 passes through the center of those toroids having $N_2$, $N_3$ and $N_4$ turns respectively creating transformers $T_2$, $T_3$ and $T_4$. Inductors, L, are placed across the terminals of transformers $T_2$ and $T_4$ while series connected capacitors, C, are placed across the terminals of transformer $T_3$. If the inductors L and capacitors C are chosen to have reactances which are much less than the impedance of the toroids $T_2$–$T_4$ over the frequency range of operation, the output voltages are in phase or $$E = E_L + E_C = \frac{jIwL}{N_2} - \frac{1}{jwCN_3} =$$

$$\frac{jI}{CN_3} \left[ \frac{(N_3)}{N_2} \left( WLC + \frac{1}{W} \right) \right]$$

Preferably $N_2 = N_3 = N$ $$LC = \frac{1}{W_1 W_2}$$

where $W_1$ and $W_2$ are the lower and upper frequency limits

In FIG. 1, E=jAI, thus $$A = \frac{1}{NC} \left[ WLC + \frac{1}{W} \right] = f(w)$$

The parameter A is frequency sensitive. In the digital implementation of FIG. 2 a look-up table is depicted; however, the above computation could be performed instead to develop A.

The generated digital values of the circuit of FIG. 3, i.e., V, U, Q, P may be provided to any suitable conventional digital processing unit to compute the impedance as shown in the block diagram of FIG. 2.

Figure 5:
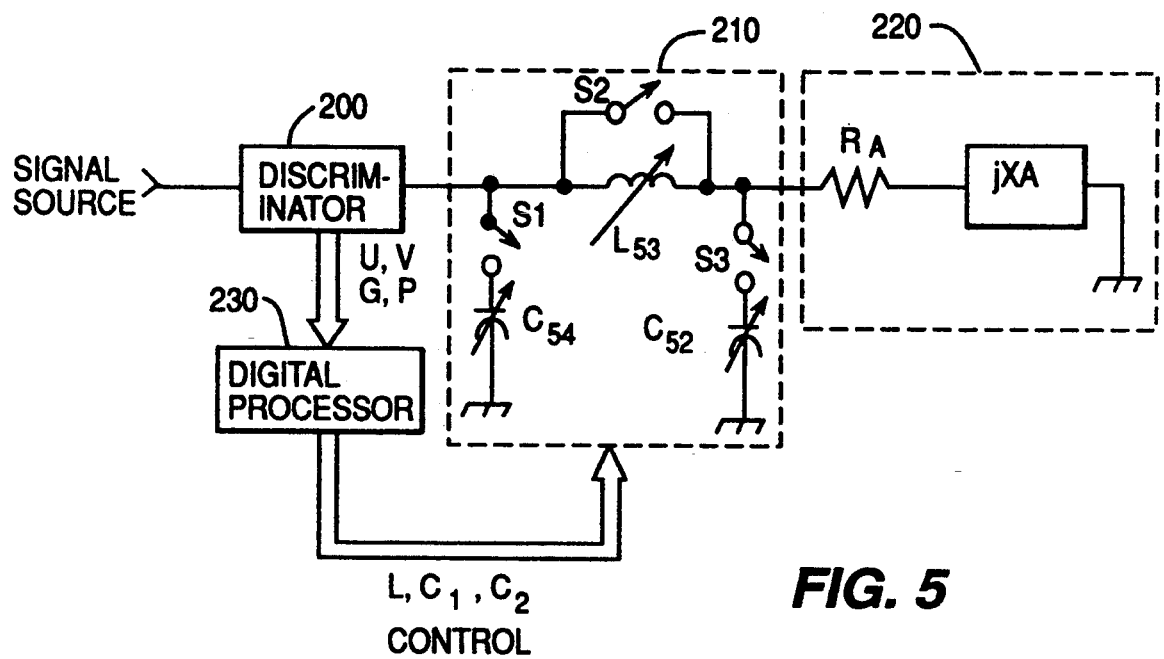
FIG. 5 is a simplified circuit diagram depicting the use of the present invention in a smart tuning scheme.

With reference to FIG. 5, the present invention may be used in an antenna coupler system in which a signal source is applied to a discriminator 200 and subsequently to a coupler 210 and ultimately to the load 220. The coupler 210 may include a variable inductor L and variable capacitors C1 and C2. The inductor L and the capacitors C1 and C2 may be shunted by switches $S_1$, $S_3$, $S_2$, all controlled by signals from the digital processor 230. If the load 220 is an antenna the current circuit may be represented by a resistor $R_A$ and complex component $jX_A$. The discriminator 200 may generate digital signals U, V, Q, P which are provided to a digital processor 230 which computes the parameters of the load and determines which of the elements of the coupler 210 should be placed within the coupling circuit.

In operation, the signal source is applied through the discriminator 200 to the load 220 with the switches S1 and S3 open and switch S2 closed. The discriminator 200 is utilized to determine the digital signals, U, V, Q and P as previously described which are passed to the digital processor 230 which computes the specific parameters (or component values) and switch settings of the coupler circuit which will match the signal source to the impedance of the load. When the component values have been computed, control signals are sent from the digital processor 230 to the coupler 210 which specifies the capacitors and impedance values and the operation of the various switches $S_1$, $S_2$, $S_3$ of the coupler 210 in accordance with the control signals.

With continued reference to FIG. 5, the digital processor 230 may compute the factors the elements C1, L, and C2 as follows:

$$A = \frac{1}{1 + Q^2}$$

$$B = 2X + 2R/Q - Ro/Q$$

-continued $$C = X^2 + R^2 - RR_o$$

$$D = B/2A$$

$$E = C/A$$

If $D^2$ is greater than E than WL may be computed by solving the following quadratic:

$$A(WL)^2 + BWL + C = 0$$

$$WL = -D + (D^2 - E)^{\frac{1}{2}}$$

If WL is greater than zero, then C2=0 and the antenna will be tuned when $C1 = 1/WX_p$ and the impedance at the coupler input will be Ro+jo.

If in the above computation it is found that $D^2$ is less than E or, when the quadratic is solved, that WL is less than 0 then: C2 is greater than 0, and a different procedure must be followed. RP and XP are the shunt parameters of the antenna and are available from the discriminator and digital processor. If $X_T$ is defined as the reactance of C2 in parallel with $X_p$, then $$X_T = X_p/(1 - WC_cX_p)$$

The new quadratic to be solved is $$AX_T^2 + BX_T + C = 0$$

The elements C2 and L may be computed as follows:

$$C_2 = (X_T - X_p)/WX_TX_P$$

$$L = -\frac{R_P^2 X_T}{W(R_P^2 + X_P^2)}$$

If the computed inductance was larger than the available inductor, a fixed capacitor C2 may be added that is larger than the computed C2. Then capacitor C1 will not be 0 but the inductance required will be lower.

The following examples indicate the method of computation of the various parameters as described above. In the examples, L is in microhenries, C1 and C2 are in Picofarads, and F is in megahertz.

Example 1

Let R=2, X=−500, Q=100, F=10, Ro=200, then: C1=406.04, L=8.5576, C2=0

Example 2

Let R=2, X=+500, Q=100, F=10, Ro=200, then: C1=0, L=70.212, C2=35.434

Example 3

Let RA=200, $X_A$=−500, Q=100, F=10, Ro=200, then: C1=0, L=7.8742, C2=0.40077

Example 4

Let $R_A$=200, $X_a$=+500, Q=100, F=10, Ro=200; then: $C_1$=0, L=7.8742, C2=55.282

While preferred embodiments of the present invention have been described, it is to be understood that the embodiments described are illustrative only and that the scope of the invention is to be defined solely by the appended claims when accorded a full range of equivalence, many variations and modifications naturally occurring to those skilled in the art from a perusal hereof.

What is claimed is:

1. A system to compute the parameters of a complex load impedance comprising:
    a signal source;
    a load;
    a transmission path for transmitting an RF signal from said signal source to said load;
    quadrature current samplers for providing measures of the current in the RF signal;
    a voltage sampler for providing a measure of the voltage in the RF signal;
    plural peak detectors to detect the peak of the measures of current and voltage;
    analog to digital converters to convert the signals output from the peak detectors to digital signals;
    a digital computational unit to compute the parameters of the impedance of the load from the digital signals and from a signal indicating the frequency of said RF signal sources, wherein the digital computation unit comprises a digital look-up table.

2. A system to compute the parameters of a complex load impedance comprising:
    a signal source;
    a load;
    a transmission path for transmitting an RF signal from said signal source to said load;
    quadrature current samplers for providing measures of the current in the RF signal;
    a voltage sampler for providing a measure of the voltage in the RF signal; wherein the voltage sampler comprises an RC network having:
    a resistor and a capacitor in parallel to each other and in series with said transmission path; and a resistor and a capacitor in parallel to each other and connected between said transmission path and a ground reference;
    plural peak detectors to detect the peak of the measures of current and voltage;
    analog to digital converters to convert the signals output from the peak detectors to digital signals;
    a digital computational unit to compute the parameters of the impedance of the load from the digital signals and from a signal indicating the frequency of said RF signal sources.

3. A system to compute the parameters of a complex load impedance comprising:
    a signal source;
    a load;
    a transmission path for transmitting an RF signal from said signal source to said load;
    quadrature current samplers for providing measures of the current in the RF signal;
    a voltage sampler for providing a measure of the voltage in the RF signal;
    plural peak detectors to detect the peak of the measures of current and voltage;
    analog to digital converters to convert the signals output from the peak detectors to digital signals;
    a digital computational unit to compute the parameters of the impedance of the load from the digital signals and from a signal indicating the frequency of said RF signal sources, wherein a signal P is produced by adding the measure of voltage in the RF signal to a phase shifted version of one of the measures of current.

4. The system of claim 3 wherein a signal Q is produced by adding the measure of voltage in the RF signal to a phase shifted version of one of the measures of current.

5. The system of claim 4 wherein the signals P and Q are peak detected by said peak detectors.

6. The system of claim 5 wherein a signal U is produced from one of said measures of the current in said RF signal.

7. The system of claim 6 wherein a signal V is produced from one of said measures of the current in said RF signal.

8. The system of claim 7 wherein the signals U and V are peak detected by said peak detectors.

9. The system of claim 8 wherein the peak detected signals U, V, P and Q are converted to digital signals by said analog to digital converters.

10. The system of claim 9 wherein the digitally converted signals U, V, P and Q are used by the digital computational unit to compute the parameters of the impedance of the load.

11. A circuit for matching the impedance characteristics of a radio frequency signal to a load comprising:
   analog discriminator means for developing analog signals related to an input radio frequency (RF) signal, said discriminator comprising:
      a quadrature current sampler for providing a measure of the current in the RF signal;
      a voltage sampler for providing a measure of the voltage in the RF signal;
      plural peak detectors to detect the peak of the measures of current and voltage;
   analog to digital conversion means for converting the peak measurement current and voltage signals to digital signals;
   digital computational unit to compute the parameters of the load from the digital signals and produce parameter signals therefrom;
   coupling means between the RF signal and the load, responsive to parameter signals to selectively change inductive and capacitive elements in and out of the circuit between the RF signal and the load.

12. The circuit of claim 11 wherein the inductive and capacitive elements are selectively removed from the circuit during the sampling of the load characteristics.

13. A method of computing the impedance of a load in a circuit for transmitting RF signals comprising the steps of:
   a) sampling first, second and third current samples of an RF signal to be transmitted and passing from a source to a load;
   b) sampling a voltage sample from the RF signal;
   c) phase shifting the first and second current samples;
   d) independently summing each of the first and second current samples with the voltage sample to produce first and second sum samples, respectively;
   e) detecting a peak signal for each of the first and second sum samples, the third current sample, and the voltage sample to provide first, second, third and fourth peak signals, respectively;
   f) converting the first, second, third and fourth peak signals to related first, second, third and fourth digital signals; and
   g) digitally processing the first, second, third and fourth digital signals to provide at least one parameter which describes the impedance of the load.

14. The method of claim 13 wherein the digital processing of step (g) includes the step of looking up values from digital look up tables.

15. The method of claim 13 wherein six different parameters which describe the load impedance are provided as a result of the digital processing of step (g).

16. The method of claim 13 including the step of selectively removing and adding inductive and capacitive elements from the circuit of which the impedance load is computed.

* * * * *